(12) United States Patent
Chaintreuil et al.

(10) Patent No.: US 10,432,139 B2
(45) Date of Patent: Oct. 1, 2019

(54) ELECTRIC ARC DETECTION IN PHOTOVOLTAIC INSTALLATIONS

(71) Applicant: Commissariat a l'energie atomique et aux energies alternatives, Paris (FR)

(72) Inventors: Nicolas Chaintreuil, Montmelian (FR); Annalaura Fasiello, Chambery (FR); Alexandre Plissonnier, Pont-de-Claix (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 201 days.

(21) Appl. No.: 14/915,370

(22) PCT Filed: Aug. 27, 2014

(86) PCT No.: PCT/EP2014/068170
§ 371 (c)(1),
(2) Date: Feb. 29, 2016

(87) PCT Pub. No.: WO2015/028508
PCT Pub. Date: Mar. 5, 2015

(65) Prior Publication Data
US 2016/0276977 A1  Sep. 22, 2016

(30) Foreign Application Priority Data

Aug. 29, 2013 (FR) ..................... 13 58268

(51) Int. Cl.
*H02S 50/10* (2014.01)
*G01R 31/12* (2006.01)
(Continued)

(52) U.S. Cl.
CPC .............. *H02S 50/10* (2014.12); *G01R 31/12* (2013.01); *H01L 31/02021* (2013.01); *H02S 50/00* (2013.01); *Y02E 10/50* (2013.01)

(58) Field of Classification Search
CPC .................. H02S 50/00; H02S 50/10; H01L 31/00–02021; G01R 31/12; Y02E 10/50;
(Continued)

(56) References Cited

U.S. PATENT DOCUMENTS 4,736,267 A  4/1988  Karlmann et al.
4,937,697 A  6/1990  Edwards et al.
(Continued)

FOREIGN PATENT DOCUMENTS

CN   1129809 A   8/1996
CN   101246195 A  8/2008
(Continued)

OTHER PUBLICATIONS

French Preliminary Search Report dated Mar. 15, 2012 in Patent Application No. FR 1156012 (with English Translation of Category of Cited Documents).
(Continued)

*Primary Examiner* — Huy Q Phan
*Assistant Examiner* — David B Frederiksen
(74) *Attorney, Agent, or Firm* — Oblon, McClelland, Maier & Neustadt, L.L.P.

(57) ABSTRACT

A method estimating a series or parallel nature and a location of an arc in a photovoltaic device, operating under direct current, including N (N=1 or N>1) strings of photovoltaic modules, connected to a charge device having a capacitive behaviour for the modules, the method including: a) detecting, at terminals of each of the modules of each string, evolution of voltage over time, during formation of an electric arc; b) identifying the modules at the terminals of which a voltage variation occurs between a first zone with stable voltage and a second zone with stable voltage for a duration of at least 5 µs, which immediately follows the voltage variation, and identifying the sign of each voltage
(Continued)

variation; c) estimating the series or parallel nature and the location of the arc in the photovoltaic device.

16 Claims, 11 Drawing Sheets

(51) Int. Cl.
*H02S 50/00* (2014.01)
*H01L 31/02* (2006.01)

(58) Field of Classification Search
CPC . Y02E 10/52; Y02E 10/56; H02H 1/00–0015; H02H 7/20
See application file for complete search history.

(56) References Cited

U.S. PATENT DOCUMENTS

| | | | |
|---|---|---|---|
| 5,452,223 A | 9/1995 | Zuercher et al. | |
| 5,561,605 A | 10/1996 | Zuercher et al. | |
| 5,726,505 A | 3/1998 | Yamada et al. | |
| 5,914,590 A | 6/1999 | Wacknov et al. | |
| 5,939,871 A | 8/1999 | Tanaka | |
| 6,111,767 A | 8/2000 | Handleman | |
| 6,339,538 B1 | 1/2002 | Handleman | |
| 6,469,487 B2 | 10/2002 | Ewert et al. | |
| 6,504,692 B1 | 1/2003 | Macbeth et al. | |
| 6,654,219 B1* | 11/2003 | Romano | H02H 1/0015 324/500 |
| 6,683,766 B1 | 1/2004 | Guo et al. | |
| 7,233,135 B2 | 6/2007 | Noma et al. | |
| 7,453,308 B2 | 11/2008 | Tihanyi | |
| 7,817,391 B2 | 10/2010 | Kimber | |
| 8,570,017 B2 | 10/2013 | Perichon et al. | |
| 8,576,520 B2 | 11/2013 | Pamer | |
| 8,924,169 B1* | 12/2014 | Ledenev | H02S 50/10 361/93.2 |
| 9,329,220 B2* | 5/2016 | Balog | H02S 50/10 |
| 2004/0150410 A1* | 8/2004 | Schoepf | H02H 1/0015 324/536 |
| 2004/0263183 A1* | 12/2004 | Naidu | G01R 31/025 324/536 |
| 2006/0198167 A1 | 9/2006 | Nakamura | |
| 2006/0256492 A1 | 11/2006 | Zhao et al. | |
| 2007/0133135 A1 | 6/2007 | Kilroy et al. | |
| 2007/0183103 A1* | 8/2007 | Sung | H02H 1/0015 361/42 |
| 2007/0208981 A1 | 9/2007 | Restrepo et al. | |
| 2008/0094867 A1 | 4/2008 | Muller et al. | |
| 2008/0180866 A1 | 7/2008 | Wong | |
| 2008/0197854 A1* | 8/2008 | Valcore | H01J 37/32082 324/500 |
| 2009/0079436 A1* | 3/2009 | Kojori | H02H 1/0015 324/520 |
| 2010/0085669 A1 | 4/2010 | Rivers, Jr. | |
| 2010/0164459 A1 | 7/2010 | Perichon | |
| 2011/0019444 A1 | 1/2011 | Dargatz et al. | |
| 2011/0090089 A1* | 4/2011 | Luo | H02S 50/00 340/653 |
| 2011/0141644 A1 | 6/2011 | Hastings et al. | |
| 2011/0301772 A1* | 12/2011 | Zuercher | H02H 7/20 700/293 |
| 2012/0053867 A1* | 3/2012 | Dunn | H02S 50/10 702/58 |
| 2012/0118348 A1 | 5/2012 | Buller | |
| 2012/0134058 A1 | 5/2012 | Pamer et al. | |
| 2012/0174961 A1 | 7/2012 | Larson et al. | |
| 2012/0206843 A1 | 8/2012 | Dargatz et al. | |
| 2012/0318320 A1* | 12/2012 | Robbins | H02H 1/0015 136/244 |
| 2013/0038971 A1* | 2/2013 | Ward | H02H 1/0015 361/86 |
| 2013/0092208 A1* | 4/2013 | Robbins | H01L 31/02021 136/244 |
| 2013/0170084 A1* | 7/2013 | Strobl | H02H 1/0015 361/79 |
| 2013/0307556 A1* | 11/2013 | Ledenev | H02S 50/10 324/509 |
| 2014/0055900 A1* | 2/2014 | Luebke | H02H 1/0015 361/93.1 |
| 2014/0119072 A1* | 5/2014 | Behrends | H02H 1/0015 363/55 |
| 2014/0142874 A1* | 5/2014 | Martin | H02S 50/10 702/58 |
| 2014/0373894 A1* | 12/2014 | Stratakos | H02S 50/00 136/244 |
| 2016/0181799 A1 | 6/2016 | Kanemaru et al. | |

FOREIGN PATENT DOCUMENTS

| | | |
|---|---|---|
| DE | 3429469 A1 | 2/1986 |
| EP | 1 796 238 B1 | 1/2013 |
| EP | 1463188 B1 | 4/2015 |
| FR | 2 912 848 A1 | 8/2008 |
| FR | 2 965 626 A1 | 4/2012 |
| FR | 2 965 627 A1 | 4/2012 |
| FR | 2 965 628 A1 | 4/2012 |
| FR | 2965626 A1 | 4/2012 |
| FR | 2965627 A1 | 4/2012 |
| FR | 2965628 A1 | 4/2012 |
| JP | 5-284654 A | 10/1993 |
| JP | 5-343722 A | 12/1993 |
| JP | 7-44252 | 2/1996 |
| JP | 10-289025 A | 10/1998 |
| JP | 11-579 A | 1/1999 |
| JP | 11-214735 | 8/1999 |
| JP | 11-312022 | 11/1999 |
| WO | WO95/25374 | 9/1995 |
| WO | WO 98/44398 A1 | 10/1998 |
| WO | WO 2006/029360 A1 | 3/2006 |
| WO | WO 2008/125915 A2 | 10/2008 |
| WO | WO 2010/072717 A1 | 7/2010 |
| WO | 2011/011711 A2 | 1/2011 |
| WO | 2011/017721 A1 | 2/2011 |
| WO | WO 2011/022340 A2 | 2/2011 |
| WO | WO 2012/012486 | 1/2012 |

OTHER PUBLICATIONS

"Mitigation and Analysis of Arc Faults in Automotive DC Networks," Schoepf, Thomas J., *IIEE Transactions of Components and Packing Technologies*, vol. 28, No. 2, Jun. 2005, pp. 319-326.

"Elektrische Sicherheit in Photovoltaik-Anlagen, Bopp, von Georg, *Forschungverund Sonnenenergie: Themen 92/93*" (with English abstract).

Combined Chinese Office Action and Search Report dated Jun. 1, 2015 in Patent Application No. 201280033220.3 (with English language translation).

U.S. Appl. No. 14/915,370, filed Feb. 29, 2016, US 2016/0276977 A1, Nicolas Chaintreuil, et al.

U.S. Appl. No. 14/915,504, filed Feb. 29, 2016, US 2016/0218669 A1, Nicholas Chaintreuil, et al.

International Search Report dated Nov. 12, 2014 in PCT/EP14/68170 Filed Aug. 27, 2014.

French Search Report dated Mar. 12, 2014 in French Application No. 13 58268 Filed Aug. 29, 2013.

U.S. Appl. No. 14/130,761, filed May 19, 2014, US 2014/0247066 A1, Nicolas Chaintreuil et al.

* cited by examiner

ELECTRIC ARC DETECTION IN PHOTOVOLTAIC INSTALLATIONS

TECHNICAL FIELD AND PRIOR ART

The invention concerns photovoltaic installations and, in particular, electric arc detection means in these installations.

Installations using photovoltaic panels (PV) are destined for development. However, this type of device is ageing and failures may appear over time. These failures can be benign (for example: shutdown, loss of production, reduced yield, etc.) however can also be more serious if an electric arc appears. Indeed, the consequence of such a phenomenon can, in the worst case scenario, trigger a fire that could result in the destruction of the building in which a PV module is installed.

FIG. 1A shows a known type of photovoltaic installation with a string 100 of 3 photovoltaic modules 1, 2, 3 and a converter (or inverter) 10, connected to the power grid 12. This representation is simplified, as a string generally comprises more than 3 modules. Furthermore, an installation can include several strings 100, 101, etc. positioned in parallel, as illustrated in FIG. 1B.

A parallel electric arc can in particular occur:
across the terminals of one or more strings, for example between points A and B in FIG. 1B, between the photovoltaic modules and the inverter 10;
or across the terminals of one or more modules.

A series electric arc can occur:
between one end of any of the strings and the conversion means 10;
in a string of modules;
or in a PV module.

We are therefore looking to develop systems designed to detect parallel or series electric arcs as soon as they appear.

Known electric arc detection solutions in low-voltage direct or alternating current installations are mainly based on ultrasonic detection (via the acoustic signature of the arc) or radiofrequency detection (via the RF signature of the arc) or even based on heat measurements (infrared signature of the arc). The signature of a phenomenon is the set of characteristics and their values that enable it to be identified in a certain manner.

For PV installations, the same type of detector is beginning to be developed by some laboratories or industrialists.

The main restriction of these systems is the means they implement to measure the signature. Indeed, given that the signatures are complex and generally involve high frequencies (for acoustic and RF signatures), they require very heavy software processing, with a high sampling rate and therefore expensive components. Moreover, the processing time, including interference or noise discrimination from the signature of the arc, can be high and range from several seconds to several minutes.

These solutions therefore do not meet the need for a fast, reliable and low-cost safety solution.

Furthermore, we are looking to be able to detect both parallel arcs and series arcs in the same device.

Methods are known for detecting series electric arcs in a PV system, however these methods are not adapted to suit the detection of parallel arcs.

For example, document FR 2912848 describes how to detect a series arc using the measurement of a fast voltage variation.

Document WO2011/17721 describes a method based on a mean current measurement, the evolution of which is observed. This solution requires long measurement and long processing methods.

Document WO2011/11711 describes a method based on comparing a current signature and a voltage signature on a power converter for a photovoltaic module. The fact of having to compare the current and voltage involves developed measurement means and computing power, and is thus expensive.

Other methods are known for detecting an arc, however they are not necessarily compatible with devices in the event that the latter operate under direct current. Hence, document US2008/180866 covers the detection of electric arcs on an AC installation using current measurements. Its teachings are not applicable to the case of an installation that can potentially operate under direct current.

Document US2010085669 covers an electric arc detector based on the software and mathematical processing of a current signal that is amplified and converted into digital values. This approach does not meet the needs of a fast and simple processing solution.

Document U.S. Pat. No. 6,504,692 describes a method for detecting electric arcs for AC systems. This detection is based on variations in voltage. However, the variation parameters (magnitude, frequency, rise/fall time, etc.) are not the same for the DC part of a photovoltaic installation.

The teachings of this document are therefore not applicable to the problem posed here, which involves finding a method for characterising electric arcs occurring in a photovoltaic installation, including in the case of operation under direct current.

Moreover, the solutions proposed in this document are complex.

However, a solution to this problem must preferably be fast and simple, without implementing expensive means.

Furthermore, there is also the issue of finding a method for characterising parallel or series electric arcs occurring in a photovoltaic installation, designed to estimate, on the one hand, its nature (series or parallel) and, on the other hand, its position in a photovoltaic installation.

DESCRIPTION OF THE INVENTION

This document describes a method for estimating the series or parallel nature and the location of an arc in a photovoltaic device comprising N (N=1 or N>1) strings of photovoltaic modules, connected to a charge device having a capacitive behaviour for the modules, this method comprising the following steps:

a) measuring, at the terminals of each of the modules of each string, the evolution of the voltage over time, at least during the formation of an electric arc, b) identifying the modules at the terminals of which a voltage variation occurs between a first duration (A) during which the voltage has a substantially stable slope and a second duration (B) during which the voltage has a substantially stable slope for a duration of at least 5 μs, which immediately follows said voltage variation, and identifying the positive or negative direction of each voltage variation, c) estimating the series or parallel nature and the location of the arc in the photovoltaic device, based on the information on the modules at the terminals of which a voltage variation occurs, and the sign of each voltage variation.

In such a method, it is also possible, before step c) and in view of observing the effective presence of an arc, to estimate the magnitude of the voltage variation and/or the duration during which this variation occurs and/or the average rate of this variation.

In such a method, when the voltage at the terminals of each of the modules of each string increases, one could conclude that a parallel arc is occurring across the main terminals of the device.

Moreover, when the voltage at the terminals of one of the modules of one of the strings of the device decreases, when the voltage at the terminals of all other modules of the same string increases, one could conclude that a parallel arc is occurring across the terminals of said module or that a series arc is occurring within said module.

In this case, when the voltage at the terminals of said module decreases to the arc voltage value, one could conclude that a parallel arc is occurring across the terminals of said module.

In this same case, when the voltage at the terminals of said module decreases from an absolute value substantially equal to $V_{arc}/((1/n_{mod})-1)$, where $V_{arc}$ is the final voltage of the arc, and $n_{mod}$ is the number of modules in the string concerned, one could conclude that a series arc is occurring within said module.

When the voltage at the terminals of each of the modules of each string increases, one could conclude that a series arc is occurring between one of the strings and said charge device.

When the voltage at the terminals of each of the modules of one of the strings increases, wherein a voltage variation is not observed at the terminals of the modules of the other strings, one could conclude that a series arc is occurring within said strings, however not within one of the modules of said string.

Finally, if a diode is present at the head of each string, and wherein, when the voltage at the terminals of each of the modules of a first string decreases, and wherein a voltage variation is not observed at the terminals of the modules of the other strings, one could conclude that a parallel arc is occurring between the diode of the first string and the charge device.

According to one specific application, the current is a direct current.

The invention also relates to a device for estimating the series or parallel nature and the location of an arc in a photovoltaic system comprising N (N=1 or N>1) strings of photovoltaic modules, connected to a charge device having a capacitive behaviour for the modules, this device comprising:

a) detection means for detecting, at the terminals of each of the modules of each string, the evolution of the voltage over time during the formation of an electric arc, b) means for identifying the modules at the terminals of which at least one voltage variation occurs, between a first duration during which the voltage has a substantially stable slope and a second duration of at least 5 µs, during which the voltage has a substantially stable slope and which immediately follows said voltage variation, and for identifying the positive or negative direction of the voltage variation, c) means for estimating the series or parallel nature and the location of the arc in the photovoltaic device, based on the information on the modules at the terminals of which a voltage variation occurs, and on the sign of each voltage variation.

Such a device can further comprise means for estimating the magnitude of said variation and/or the duration during which this variation occurs and/or the mean rate of this variation, in order to observe the effective presence of an arc.

Preferably, when the detection means at the terminals of each of the modules of each string detect a voltage decrease, one could conclude that a parallel arc is occurring across the main terminals of the device.

Preferably, when the detection means at the terminals of one module of one of the strings of the device detect a voltage decrease, when the detection means at the terminals of all other modules of the same string detect a voltage increase, one could conclude that a parallel arc is occurring across the terminals of said module or that a series arc is occurring within said module.

In this case, when the detection means at the terminals of said module detect a voltage decrease to the arc voltage value, one could conclude that a parallel arc is occurring across the terminals of said module.

In this same case, when the detection means at the terminals of said module detect a decrease from an absolute value substantially equal to $V_{arc}/((1/n_{mod})-1)$, where $V_{arc}$ is the final voltage of the arc, and $n_{mod}$ is the number of modules in the string concerned, one could conclude that a series arc is occurring within said module.

Moreover, when the detection means at the terminals of each of the modules of each string detect a voltage increase, one could conclude that a series arc is occurring between any one of the strings and said charge device.

When the detection means at the terminals of each of the modules of a string detect a positive voltage variation, when the detection means at the terminals of all other modules of the other strings do not detect a voltage variation, one can conclude that a series arc is occurring within one of the strings, however not within one of the modules of said string.

Finally, if a diode is present at the head of each string, when the voltage at the terminals of each of the modules of a first string decreases, wherein a voltage variation is not observed at the terminals of the modules of the other strings, one could conclude that a parallel arc is occurring between the diode of the first string and the charge device.

In a device or a method according to the invention means can be implemented for filtering frequencies at least equal to 100 Hz.

Filtering means forming a passive filter or forming an active filter and/or analogue and/or digital filtering means can be used.

Means can be provided for digitising the voltages measured.

The device or means having a capacitive behaviour for the modules can include a converter, an inverter or a battery.

A series or parallel arc, the series or parallel nature and the location of which we are looking to estimate, can produce a voltage variation at the terminals of each of several modules of the device.

DETAILED DESCRIPTION OF THE SPECIFIC EMBODIMENTS

Figure 1A:
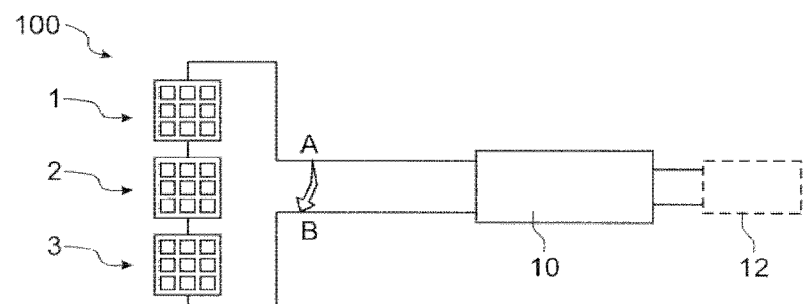
FIGS. 1A and 1B schematically show known types of photovoltaic installations.
Figure 1B:
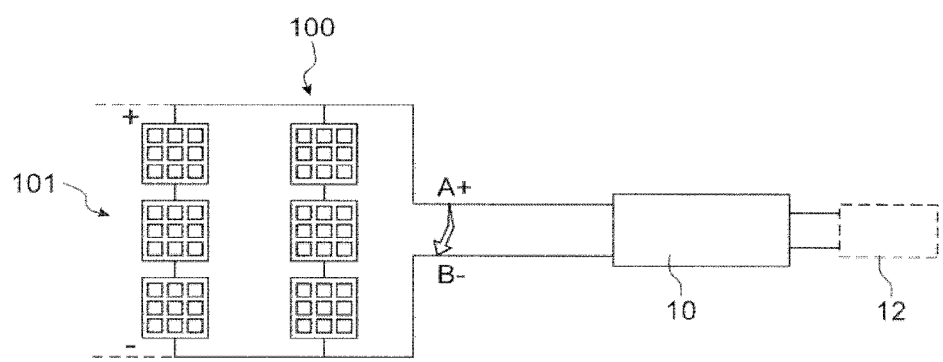
Figure 1C:
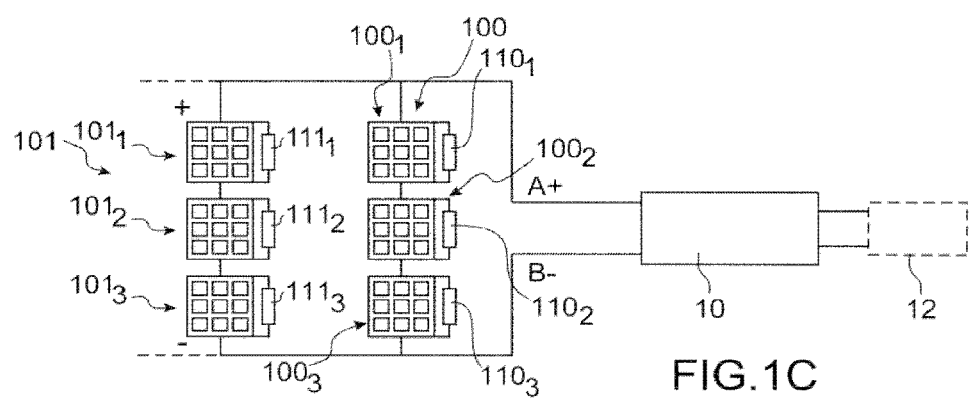
FIGS. 1C and 1D schematically show a general structure of a photovoltaic installation, with means for detecting and measuring a voltage, positioned at the terminals of each photovoltaic module, FIG. 1E schematically shows one example of switching means capable of being implemented in the installation in FIGS. 1C and 1D.
Figure 1E:
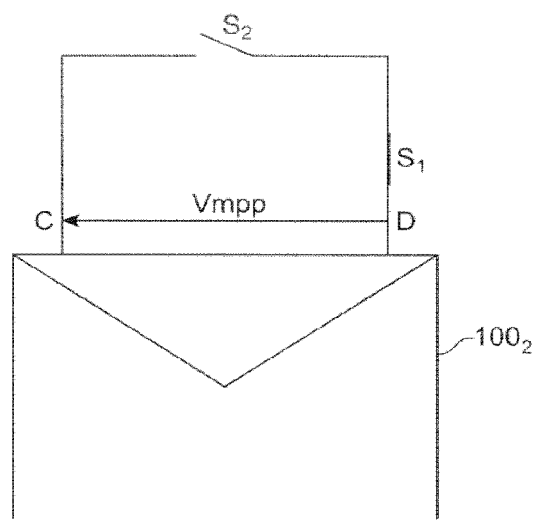
Figure 1D:
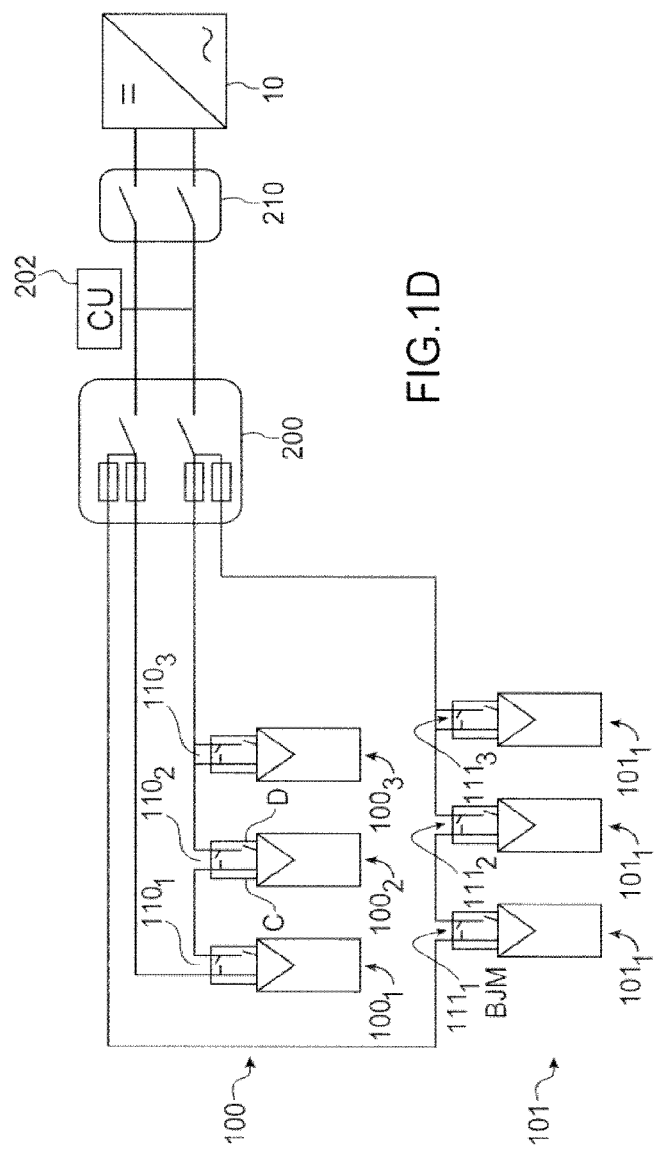

FIGS. 1C and 1D schematically show the structure of a photovoltaic installation (the abbreviation PV is also used in the remainder of the description hereinbelow), comprising 2 strings 100, 101 of photovoltaic modules $100_1$, $100_2$, $100_3$, $101_1$, $101_2$, $101_3$, the different modules $100_1$-$100_3$, $101_1$-$101_3$ of the same string being connected in series. A photovoltaic module refers to a monolithic assembly of photovoltaic cells.

This description is not limited to one or two strings, each comprising three photovoltaic modules, but applies to any number $n_{mod}$ of said modules in a string and/or any number $N_c$ of strings.

Each of the modules is equipped with means $110_1$, $110_2$, $110_3$, $111_1$, $111_2$, $111_3$ for measuring the voltage at its terminals. Preferably, each of these means periodically samples the voltage at the terminals of the module to which it is associated. In the remainder of the document hereinbelow, $V_{mpp}$ will refer to the voltage at the terminals of one of these means, in the case of normal operation, without the presence of an electric arc (neither in the corresponding module, nor in another module). According to one example embodiment, each module is equipped with a board comprising switching means such as those described in patent applications FR 2 965 626, FR 2 965 627 or FR 2 965 628 and voltage measurement means. It is this board that is referred to in FIG. 1D via the references $110_1$-$110_3$, $111_1$-$111_3$. One example of such switching means is schematically shown in FIG. 1E, where these means are connected between the output terminals C and D of a PV module. Within the scope of this invention, we will preferably be limited to the configuration illustrated in this FIG. 1E, wherein the switch S1 is closed, whereas the switch S2 is in the open position. This same configuration is represented in FIG. 1D, wherein the different modules $100_1$-$100_3$, $101_1$-$101_3$ of the same string are thus connected via a series link.

In the 2 structures shown in FIGS. 1C and 1D, an element 10 imposes a capacitive charge at the output of the installation, or a capacitive behaviour for the modules, such as a converter, inverter or a battery.

This element 10 is connected to the power grid 12.

For each string, there are 2 free terminals with ends that are not connected to another serial detector of the same string. As shown in FIG. 1D, the different free terminals of the different strings can be combined in means 200, such as a combiner box, so as to connect the strings of detectors in parallel, whereby the detectors are themselves connected via a series link in the same string.

A switch/disconnector 210 can be positioned at the output of the means 200, upstream of the means 10 (for example a converter, an inverter or a battery). The reference 202 refers to a central processing unit, which is used to store the voltage measurement data originating from the different voltage measurement means $110_1$-$110_3$ or $111_1$-$111_3$. It can be used or programmed to process this voltage measurement data.

The voltage and the current flowing through the photovoltaic modules depend on several parameters (sunshine, temperature) and can vary significantly.

Figure 2:
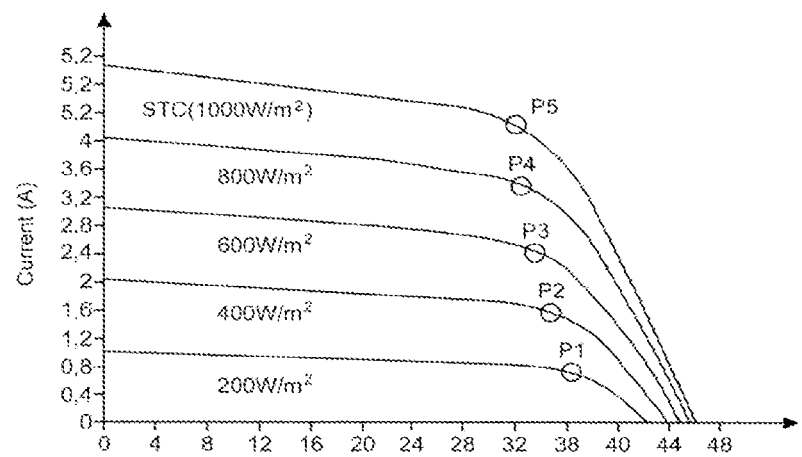
FIG. 2 shows the current/voltage curves characteristic of a photovoltaic module.

FIG. 2 shows the curves that are characteristic of a photovoltaic module according to the level of illumination received (from 200 to 1,000 W/cm$^2$). The current flowing through the module varies greatly according to this illumination (proportionally thereto in a first approximation). The operating points P1, P2, . . . Pk on the curves in FIG. 2 are the points at which the module delivers maximum power for a given illumination.

In order to optimise energy generation, the converter or inverter 10 imposes an operating voltage on the modules so that the latter generate the maximum amount of power (this function is known as: MPPT="maximum power point tracking").

A parallel electric arc can occur across the terminals of one or more strings 100, 101 (for example a parallel arc can occur between the points A and B of FIG. 1C), or across the terminals of one of the modules $100_1$-$100_3$, $101_1$-$101_3$ of one of the strings (in other words: between the cells of a module).

A series electric arc can occur between one end of any of the strings and the conversion means 10, or in a string of modules or in a PV module.

As a reminder a "parallel" arc is understood as being an arc that occurs between points that have different potentials, whereas a "series" arc occurs between points or terminals that have identical potentials.

Via their input capacitance or their capacitive input charge, the means 10 allow for a stable output voltage to be maintained for the strings of the PV modules throughout the duration of arc generation. As already stipulated hereinabove, an alternative embodiment provides for an inverter or a capacitive charge such as a converter or a battery, which would produce the same stabilising effect.

When an arc is produced, the final minimum value of the arc voltage $V_{arc}$ is about 10 V. It is linked to the physical properties of an electric arc. Indeed, as previously explained in document FR 2 912 848, an electric arc can be broken down into 3 zones:

1 electrode/air interface zone;
1 plasma zone;
1 air/electrode interface zone.

The two interface zones appear as a P-N junction of a diode, i.e. a junction between a conductive material and an insulator.

This junction therefore has a fixed potential that is directly linked to the potentials of the materials present. That of air does not vary, however that of the electrode can vary according to whether the electrode is made from copper, aluminium or silver, etc. This potential is therefore present at each interface and is characteristic of the arc. It appears as soon as arcing occurs (before the establishment of the plasma) and its value, $V_{arc}$, measured across the terminals of the arc, is between 10 V and 20 V or even 30 V.

Figure 3A:
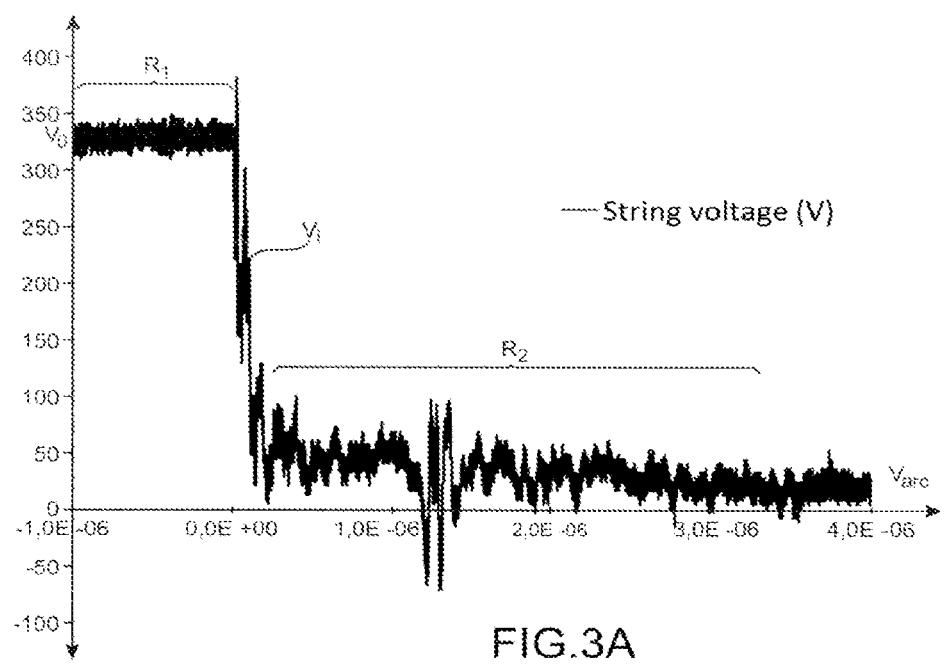
FIGS. 3A and 3B show the variations of a voltage over time when a parallel electric arc occurs across the terminals of a photovoltaic device, the voltage filtered being further shown in FIG. 3B, FIGS. 4A-4C show various configurations of parallel electric arcs.
Figure 3B:
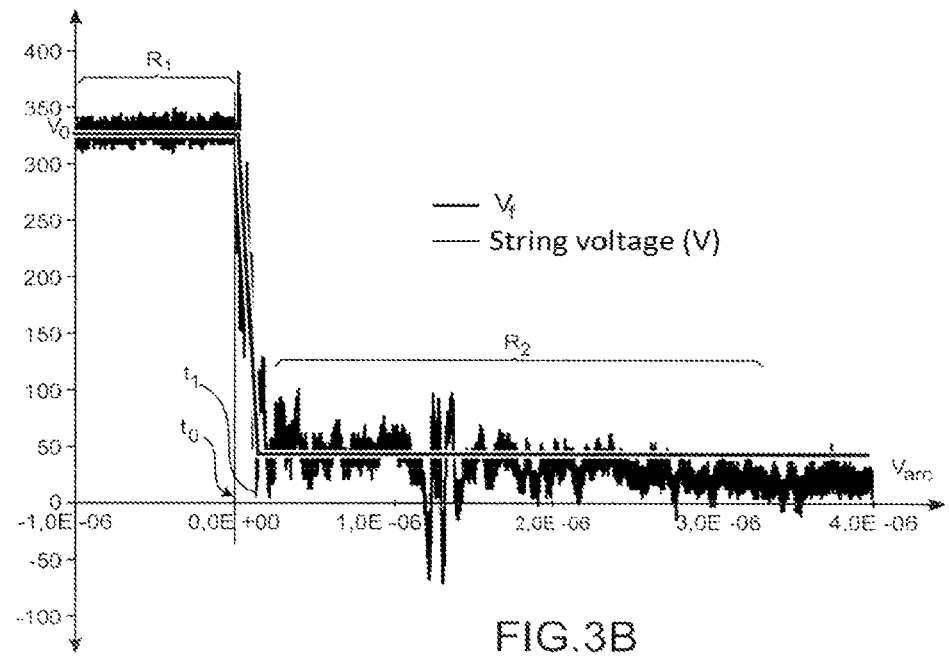

In the case of a parallel electric arc, the instant voltage evolution $V_{ip}$ at the terminals of the arc can take on the shape shown in FIG. 3A. The voltage $V_{fp}$ resulting from the filtering of the instant voltage $V_{ip}$ is also shown in FIG. 3B. A voltage variation, caused by the appearance of the arc, occurs between a 1$^{st}$ stable voltage zone (zone $R_1$ in FIGS. 3A and 3B), at a voltage value $V_{0p}$ known as the initial value, and a 2$^{nd}$ stable voltage zone (zone $R_2$ in FIGS. 3A and 3B), at the value $V_{arc}$, the final value of the arc voltage. This 2$^{nd}$ stable zone lasts at least several µs, for example at least 5 µs or at least 10 µs. The oscillations observed in the zones $R_1$ and $R_2$ are mainly caused by the measurement.

On a whole, a very clear drop in the voltage measured is observed.

Despite the variable voltage oscillations observed at the beginning of the instant voltage $V_{ip}$ front, the signature of the arc is characterised, between the 1$^{st}$ stable voltage zone and the 2$^{nd}$ stable voltage zone, by a negative evolution $\Delta V$ (=$V_{arc}$-$V_0$) of the voltage $V_{ip}$ (however also of $V_{fp}$, as the latter is directly deduced from $V_{ip}$, by curve-fitting) of an absolute value of—in the case of an arc occurring between the points A and B—between 1,500 V and 10 V. In the example shown in FIGS. 3A and 3B, the absolute value $\Delta V$ is about 350 V.

For the same illumination, the magnitude of the instant voltage evolution depends on the position or the location of the parallel arc in the system: it will be different if it occurs between the terminals A and B (these terminals are represented in FIGS. 1A-1C) or, as will be shown hereinbelow, at the terminals of one of the modules of a string.

Another parameter of a parallel electric arc appearing in a photovoltaic system is the fall time $\Delta T$ of the decrease of the signature of the electric arc (from $t_0$ to $t_1$ on the curve II in FIG. 3 B, wherein $t_0$ identifies the moment considered to be the start of the arc and $t_1$ identifies the moment considered to be the end of the arc). $\Delta T$ is measured between the initial value $V_0$ of the voltage and the final value $V_{arc}$, with an error margin, for example ±10%, this error margin being a result of the noise on the waveform. This fall time is linked to the physical properties of the photovoltaic modules and their dynamic behaviour. A photovoltaic module represents a certain variable stray capacitance value. It therefore has a response time to a voltage step characteristic to it. This time varies very little according to the different photovoltaic module technology implemented. This fall time $\Delta T$ can be between 0.01 µs and 10 µs.

These specific features are used to identify or qualify, between 2 stable voltage zones, the signature of a parallel electric arc in a PV system.

In the remainder of the document hereinbelow, regardless of whether it refers to the case of a parallel arc or a series arc, the voltage measurements made using the means $110_1$-$110_3$ or $111_1$-$111_3$ are used. The voltage variation describes the difference $V_{final}$-$V_{initial}$ between the final voltage and the initial voltage measured by these means.

The case of a parallel electric arc is firstly considered, occurring between the terminals A and B in FIG. 1C.

Figure 4A:
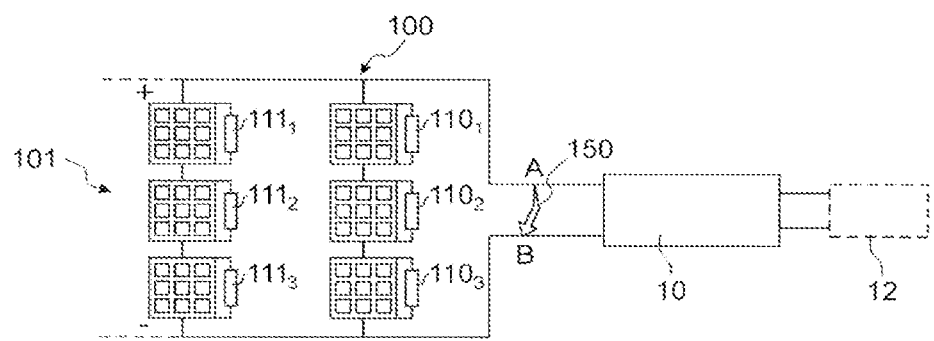

This case is shown in FIG. 4A, where the arc has the reference 150.

In accordance with that described hereinabove, it is recalled that, between the terminals A and B themselves, the voltage passes from a value $V_{MPP}$ (voltage difference between A and B), for example about 350 V to a value between 10 and 30 V (=$V_{arc}$) in a time $t_{arc}$ of between 0.01 µs and 10 µs.

The voltage measured by each of the voltage measurement means $110_1$-$110_3$ or $111_1$-$111_3$ evolves from an initial value to a final value with a negative slope. More precisely, the voltage at the terminals of each of these detectors will pass from an initial value $V_{mpp}$ to a final value $V_{arc}/n_{mod}$, where $V_{arc}$ is that already defined hereinabove and where $n_{mod}$ is the number of PV modules in the string in which the detector is located. The voltage variation, in the aforementioned sense, is therefore $V_{arc}/n_{mod}$-$V_{mpp}$.

This variation will have an absolute value of about several tens or hundreds of mV, for example between 0.01 V and 1 V. The fall time is substantially equal to $t_{arc}$, included within the aforementioned limits (0.01 µs-10 µs).

The identification of the voltage variation $V_{arc}/n_{mod}$-$V_{mpp}$ at the terminals of each of the detectors of each of the different strings is used to estimate whether a parallel electric arc has occurred between the terminals A and B.

Figure 4B:
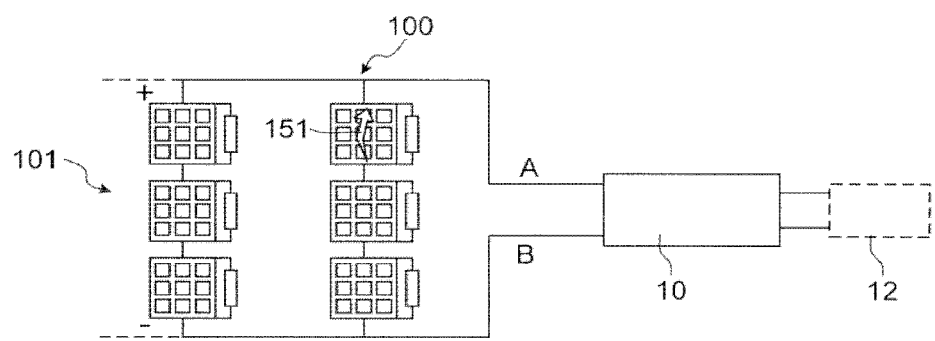

One now considers the case of a parallel electric arc occurring between the terminals of one of the modules $100_1$-$100_3$, $101_1$-$101_3$ of one of the strings 100, 101, . . . . This case is shown in FIG. 4B, where the arc has the reference 151. In this case, the voltage measured by the detector associated with the module between the terminals at which the arc occurs, evolves with a negative slope, passing from $V_{mpp}$ to $V_{arc}$ with a fall time that can be between 0.01 µs and 10 µs.

Measured at the terminals of another module of the same string, different from that at the terminals of which the arc occurs, the voltage varies in this case from an initial value $V_{mpp}$ to a final value $V_{mpp}$+($V_{mpp}$-$V_{arc}$)/($n_{mod}$-1), with a positive slope. Indeed, the voltage variation at the terminals of the module where the arc occurs is distributed to the other modules of the same string, as the voltage at the terminals of the whole string does not vary.

However, the detectors associated with the modules of a string different to that containing the modules at the terminals of which the arc occurs, cannot identify any voltage variation that could be linked to this arc.

The identification of such a voltage variation with a negative slope $V_{arc}$-$V_{mpp}$ at the terminals of one of the modules of a string, when the other detectors of the other modules of the same string detect a voltage variation with a positive slope, allows one to conclude that a parallel electric arc has occurred between the terminals of the module for which the voltage variation with a negative slope was detected.

Figure 4C:
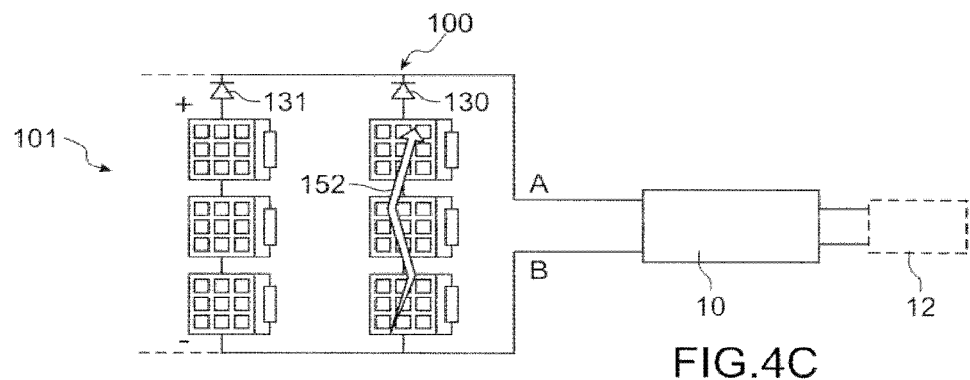

In some cases, a diode 130, 131 can be positioned at the head of each string in order to prevent any return current from one string to the other. This configuration is shown in FIG. 4C. This is in particular the case if there are more than 3 strings. The difference in potential added by a diode in such a string is negligible in relation to the voltages concerned in the string. However, in this case, an arc 152 can occur between the anode of one of the diodes 130, 131 and the means 10.

The voltage measured by each of the voltage measurement means $110_1$-$110_3$ in the string in which the arc occurs thus evolves from an initial value to a final value with a negative slope. More precisely, the voltage at the terminals of each of these detectors will pass from an initial value $V_{mpp}$ to a final value $V_{arc}/n_{mod}$, where $n_{mod}$ is the number of PV modules in the string in which the detector is located, the voltage variation thus being $V_{arc}/n_{mod}$-$V_{mpp}$.

However, no voltage variation is measured by the means $111_1$-$111_3$ of a different string to that in which the arc occurs.

In the various parallel arc cases considered hereinabove, the nature of the arc can be observed or confirmed by the magnitude of the voltage variation measured at the terminals of one or more of the modules on the one hand, and by the rise time or fall time value, which can be substantially between 0.01 µs and 10 µs.

For example, in the first case of a parallel electric arc considered hereinabove, the magnitude of the negative voltage variation seen at the terminals of a module is $V_{arc}/n_{mod}$-$V_{mpp}$ for a fall time $t_{arc}$ that can be substantially between 0.01 µs and 10 µs.

In a similar or equivalent manner, an arc can be identified by:
 the rise or fall time value and by the slope of the voltage variation during its evolution over time;
 or the voltage variation ΔV and by the slope of the voltage variation during its evolution over time.

In the first case of parallel electric arcs considered, the arc can thus be identified in a similar or equivalent manner by:
 the value of the fall time $t_{arc}$ and by the slope $(V_{arc}/n_{mod}$-$V_{mpp})/t_{arc}$ of the voltage variation measured each of the detectors (taking into account the minimum and maximum values of $t_{arc}$ this slope will be between $10^2$ $(V_{mpp}$-$V_{arc}/n_{mod})$V/µs and $10^{-1}(V_{mpp}$-$V_{arc}/n_{mod})$ V/µs);
 or the voltage variation ΔV and by the slope $(V_{mpp}$-$V_{arc}/n_{mod})/t_{arc}$ of the voltage variation measured by each of the detectors, which will be within the aforementioned limits.

The same characterisation applies to the other two cases of a parallel arc described hereinabove.

In the $2^{nd}$ case of a parallel electric arc considered hereinabove, the magnitude of the negative voltage variation at the terminals of the module at the terminal of which the arc occurs is $V_{arc}$-$V_{mpp}$ for a fall time $t_{arc}$ that can be substantially between 0.01 µs and 10 µs.

The arc can thus be identified by:
 the value of the fall time $t_{arc}$ and by the slope $(V_{arc}$-$V_{mpp})/t_{arc}$ of the voltage variation measured by each of the detectors (taking into account the minimum and maximum values of $t_{arc}$ this slope will be between $10^2(V_{arc}$-$V_{mpp})$V/µs and $10^{-1}(V_{arc}$-$V_{mpp})$ V/µs);
 or the voltage variation ΔV and by the slope $(V_{arc}$-$V_{mpp})/t_{arc}$ of the voltage variation measured by each of the detectors, which will be within the aforementioned limits.

Still with regard to this $2^{nd}$ case, the magnitude of the positive voltage variation at the terminals of the modules different to that at the terminals of which the arc occurs is $(V_{mpp}$-$V_{arc})/(n_{mod}$-1) for a rise time $t_{arc}$ that can be substantially between 0.01 µs and 10 µs.

The arc can thus be identified by:
 the value of the rise time $t_{arc}$ and by the slope $(V_{mpp}$-$V_{arc})/(n_{mod}$-1)/$t_{arc}$ of the voltage variation measured for each of these other modules (taking into account the minimum and maximum values of $t_{arc}$ this slope will be between $10^2(V_{mpp}$-$V_{arc})/(n_{mod}$-1) V/µs and $10^{-1}$ $(V_{mpp}$-$V_{arc})/(n_{mod}$-1) V/µs);
 or the voltage variation ΔV and by the slope $(V_{mpp}$-$V_{arc})/(n_{mod}$-1)/$t_{arc}$ of the voltage variation measured by each of the detectors, which will be within the aforementioned limits.

In the $3^{rd}$ case of a parallel electric arc considered hereinabove, the magnitude of the negative voltage variation at the terminals of each of the modules of the string is $V_{arc}/n_{mod}$-$V_{mpp}$ for a fall time $t_{arc}$ that can be substantially between 0.01 µs and 10 µs.

The arc can thus be identified by:
 the value of the fall time $t_{arc}$ and by the slope $V_{arc}/n_{mod}$-$V_{mpp}/t_{arc}$ of the voltage variation measured by each of the detectors of the string concerned (taking into account the minimum and maximum values of $t_{arc}$ this slope will be between $10^2$ $V_{arc}/n_{mod}$-$V_{mpp}$ V/µs and $10^{-1}(V_{arc}/n_{mod}$-$V_{mpp})$V/µs);
 or the voltage variation ΔV and by the slope $(V_{arc}/n_{mod}$-$V_{mpp})/t_{arc}$ of the voltage variation measured by each of the detectors of the string concerned, which will be within the aforementioned limits.

Figure 5:
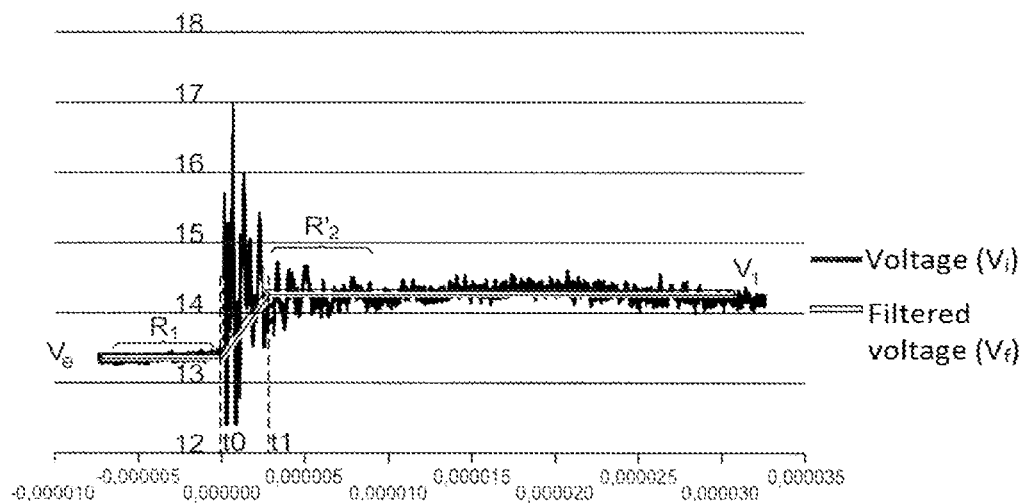
FIG. 5 shows the variations of a voltage over time when a series electric arc occurs across the terminals of a photovoltaic device.

The signature that is characteristic of a "series"-type electric arc is substantially different to that of a parallel arc, as it comprises an increasing voltage evolution, which can take on the shape shown in FIG. 5. The voltage $V_{fs}$ resulting from the filtering of the instant voltage $V_{is}$ is also shown in this figure. It is noted that the voltage variations occur between a $1^{st}$ stable voltage zone (zone $R'_1$ in FIG. 5), at a voltage value $V_{0s}$ known as the initial value, and a $2^{nd}$ stable voltage zone (zone $R'_2$ in FIG. 5), at a voltage value $V_{0s}$+$V_{arc}$, referred to as the final value, with a positive slope. This $2^{nd}$ stable zone lasts at least several µs, for example at least 5 µs or at least 10 µs.

Overall, an increase in the measured voltage is observed, from $V_{0s}$ to $V_{1s}$=$V_{0s}$+$V_{arc}$.

Again, another parameter of a series electric arc appearing in a photovoltaic system is the rise time ΔT of the voltage front (from $t_0$ to $t_1$ on the curve II in FIG. 5), which is measured between the initial voltage value and the final voltage value, with an error margin, for example ±10%, this error margin being caused by the noise on the waveform. This rise time is linked to the physical properties of the photovoltaic modules and their dynamic behaviour. As already explained hereinabove, a PV module represents a certain stray capacitance value or variable equivalent, therefore a response time at a voltage step that is characteristic to it, however this time varies very little according to the different PV module technology used and is between 0.5 µs and 5 µs.

These specific features are used to characterise or qualify, between 2 stable voltage zones, the signature of a series electric arc, characteristic of the environment of a PV system.

The rise and fall time ranges stipulated hereinabove and concerning the situations wherein a parallel arc occurs and those wherein a series arc occurs, are relatively close and equal to 0.01 µs-10 µs and 0.5 µs-5 µs respectively. For simplification purposes, the same interval can be considered, for example 0.01 µs-10 µs, for both cases.

This document will now explain how the existence of a series arc can be determined or characterised, and how its position can be estimated, according to the voltage variation data provided by the detectors $110_1$-$110_3$, or $111_1$-$111_3$.

Figure 6A:
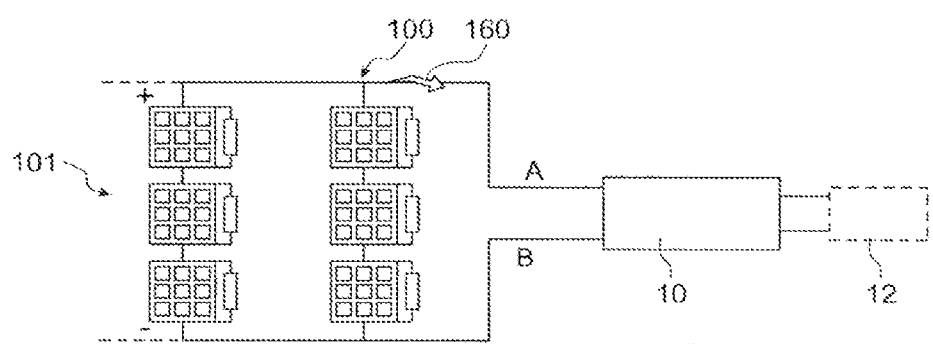
FIGS. 6A-6C show various configurations of a "series"-type electric arc.

The case of a series electric arc is firstly considered, occurring between the output of any one of the strings and the means 10. This case is shown in FIG. 6A, where the arc has the reference 160. In this case, the voltage measured by each of the voltage measurement means $110_1$-$110_3$ or $111_1$-$111_3$ therefore evolves from an initial value to a final value with a positive slope. More precisely, the voltage at the terminals of each of these detectors will pass from an initial value $V_{mpp}$ to a final value $V_{mpp}$+$V_{arc}/n_{mod}$, where $n_{mod}$ is the number of PV modules in the string in which the detector in located, the voltage variation thus being $V_{arc}/n_{mod}$.

The identification of such a voltage variation at the terminals of each of the detectors is used to determine whether a series electric arc, located as shown hereinabove, is present.

One will now consider the case of a series electric arc that occurs within a sole string of the strings 100, 101 (regardless of the position outside of any one of the modules of this same string). This case is that shown in FIG. 6B, where the arc has the reference 161. In this case, the voltage measured by each detector associated with any module of this string increases, passing from $V_{mpp}$ to $V_{mpp}+V_{arc}/n_{mod}$.

However, the detectors associated with the modules of another string cannot identify any voltage variation.

The identification of the voltage variation $V_{arc}/n_{mod}$ at the terminals of each of the detectors of the same string, when the detectors associated with the modules of another string do not detect any voltage variation, is used to conclude that a series electric arc has occurred within said string only, however not within one of the modules of said string.

In the 2 aforementioned series arc detection cases, a signature is identified on the voltage measurement, characteristic of an electric arc, that is materialised, at the terminals of the modules of a string or of several strings, by a fast voltage increase, with a rise time $\Delta T$ of between 0.5 μs and 5 μs.

The voltage variations occur between a $1^{st}$ stable voltage zone at a voltage value $V_{mpp}$ known as the initial value, and a $2^{nd}$ stable voltage zone at a voltage value $V_1$ ($V_{mpp}+V_{arc}/n_{mod}$) referred to as the final value. This $2^{nd}$ stable zone lasts at least several μs, for example at least 5 μs or at least 10 μs.

After the rise front, the voltage is established at the final value $V_1$ of the voltage front, equal to about $V_{mpp}+V_{arc}/n_{mod}$, and remains substantially at this value for the minimum duration stipulated hereinabove.

Figure 6B:
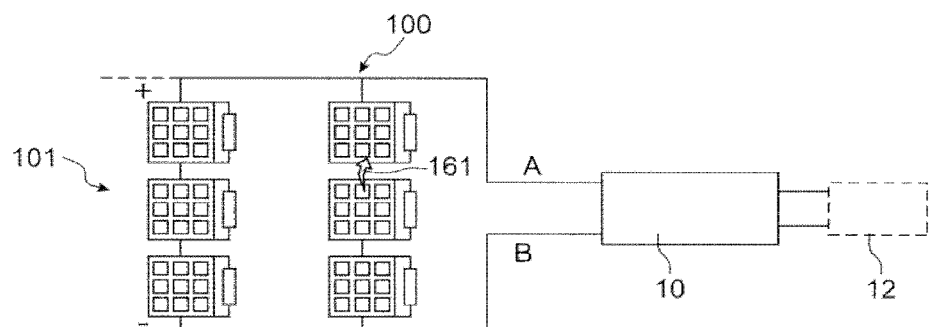
Figure 6C:
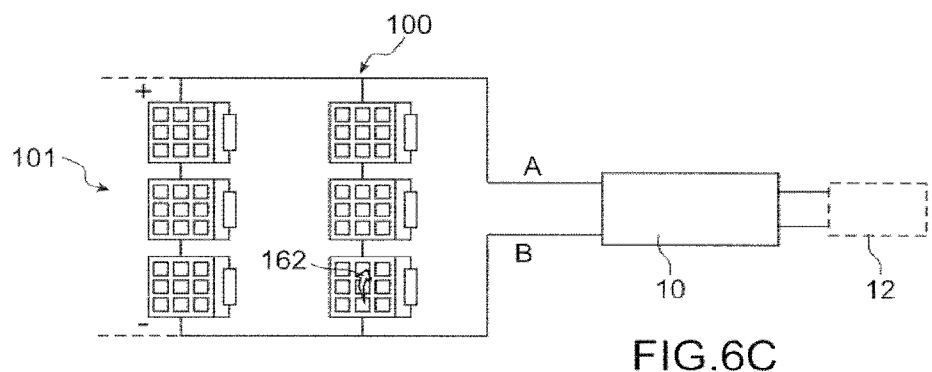

Finally, the case of a series electric arc that occurs within one module of one of the strings 100, 101, ... , or between the cells of such a module, is illustrated in FIG. 6C, wherein the arc is marked using the reference 162.

The voltage measured by the detector associated with the module, inside which the arc occurs, evolves with a negative slope, passing from $V_{mpp}$ to $V_{mpp}-V_{arc}\times(1/n_{mod}-1)$.

Measured at the terminals of another module of the same string, different from that inside which the series arc occurs, the voltage varies with a positive slope and passes from an initial value $V_{mpp}$ to $V_{mpp}+V_{arc}/n_{mod}$. Indeed, the voltage variation at the terminals of the module inside which the arc occurs is distributed to the other modules of the same string, as the voltage at the terminals of the whole string does not vary.

However, the detectors associated with the modules of another string cannot identify any voltage variation associated with this specific arc.

The identification of a negative voltage variation at the terminals of one of the detectors of a string, with a final value $V_{mpp}-V_{arc}\times(1/n_{mod}-1)$, when the other detectors of the same string detect a positive voltage variation, can be used to conclude the existence of a series electric arc within the module for which the negative voltage variation was detected.

In the various cases of "series"-type arcs considered hereinabove, the nature of the arc can be observed or confirmed by the magnitude of the voltage variation on the one hand, and by the rise time or fall time value, which can be substantially between 0.5 μs and 5 μs.

For example, in the first cases of a series electric arc considered hereinabove, the magnitude $\Delta V$ of the positive voltage variation seen at the terminals of each of the modules of one or more strings is $V_{arc}/n_{mod}$ for a rise time $t_{arc}$ that can be substantially between 0.5 μs and 5 μs.

In a similar or equivalent manner, an arc can be identified by:
the rise or fall time value and by the slope of the voltage variation during its evolution over time;
the voltage variation $\Delta V$ and by the slope of the voltage variation during its evolution over time.

In the first case of series-type electric arcs considered, the arc can thus be identified in a similar or equivalent manner by:
the value of the rise time $t_{arc}$ and by the slope $V_{arc}/n_{mod}/t_{arc}$ of the voltage variation at the terminals of the modules of the string or strings concerned (taking into account the minimum and maximum values of $t_{arc}$, slope will be between $2\times(V_{arc}/n_{mod})$/μs and $0.2(V_{arc}/n_{mod})$ V/μs);
the voltage variation $\Delta V$ and by the slope $(V_{arc}/n_{mod})/t_{arc}$ of the voltage variation, which will be within the aforementioned limits.

The same characterisation applies to the $3^{rd}$ case of a series arc described hereinabove.

It is understood from the aforementioned explanations that the parallel or series nature of an arc can be estimated according to the number of detectors that effectively detect a voltage variation at the terminals of the corresponding modules and of the sign of this variation. Based on the same criteria, one can also estimate the position of an arc in a photovoltaic assembly, whereby the arc can be located as in one of the FIGS. 4A-4C and 6A-6C.

Moreover, as explained hereinabove, one criterion for estimating whether an arc is present can be:
the final voltage value, after variation, and/or the magnitude of this variation, and the duration (rise time or fall time) during which this variation occurs or the mean rate or the slope of this variation;
or even said duration during which said variation occurs and said mean rate or said slope of said variation.

The term "estimate" must be understood as expressing a possible diagnosis, however with a margin of error (for example ±10% or even 20%), or as expressing a given probability.

Therefore, a positive voltage variation occurring at the terminals of all of the modules of all of the strings will probably indicate the existence of a series arc at the head of the photovoltaic installation (FIG. 6A).

A positive voltage variation occurring at the terminals of all of the modules of the same string, however not at the terminals of the modules of any other string, can be viewed as indicating the existence of a series arc in this string (in the connections between the modules or upstream of the modules) (FIG. 6B).

A negative voltage variation at the terminals of a single module of the same string, when the voltage variation is positive for the other modules of the same string, may indicate:
a parallel arc across the terminals of the module showing the negative voltage variation, if the final value of the latter is equal to the voltage $V_{arc}$ (case shown in FIG. 4B);
or a series arc located within the module showing the negative voltage variation, if the final value of the latter is equal to the voltage $V_{mpp}-V_{arc}\times(1/n_{mod}-1)$ (case shown in FIG. 6C).

A negative voltage variation occurring at the terminals of all of the modules of all of the strings will probably indicate the existence of a parallel arc at the head of the photovoltaic installation (as shown in FIG. 4A).

Finally, in the case in which a diode is present and positioned at the head of each string, a negative voltage variation occurring at the terminals of all of the modules of the same string, however not at the terminals of the modules of any other string, will probably indicate the existence of a parallel arc at the head of the photovoltaic installation (as shown in FIG. 4C).

In all of the aforementioned cases, regardless of whether they concern a positive or negative variation, the duration of the variation (i.e. the rise time or fall time) is in one of the aforementioned ranges, and the variation occurs between a $1^{st}$ stable voltage zone and a $2^{nd}$ stable voltage zone, as explained hereinabove.

According to the sign and the voltage variation values observed, an operator and/or data processing means 202, 77 (FIGS. 1D, 9-11) specially programmed for this purpose, could estimate the nature of an arc and/or its position or location, for example by comparison with the reference values.

Potentially, they are also capable of, or programmed to qualify or confirm the existence of an arc according to one of the aforementioned criteria. These means 202, 77 can, for example, include a microprocessor or a computer.

Figure 7A:
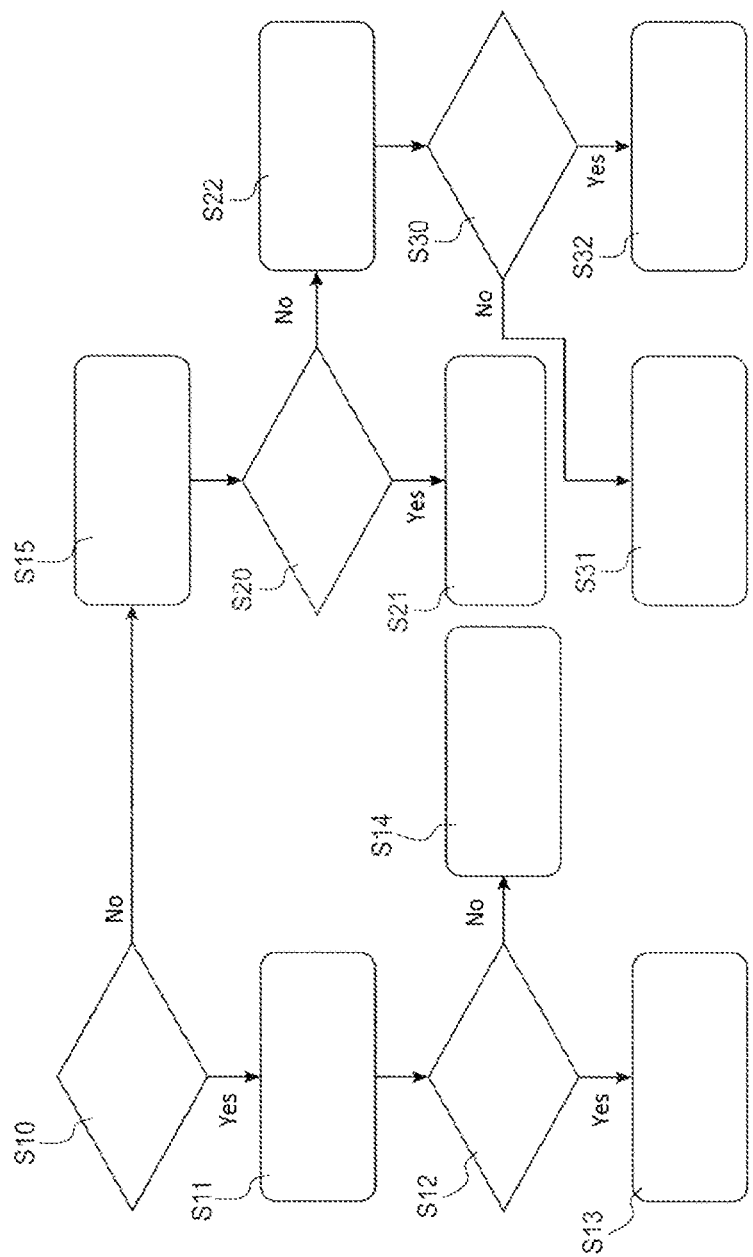
FIGS. 7A and 7B show an example embodiment of a method according to the invention, and an alternative of this example embodiment.

FIG. 7A shows another example of a method that can be implemented within the scope of this invention, for example using the aforementioned means 202, 77.

Each of the detectors periodically samples the voltage at the terminals of the module to which it is associated.

We firstly test (step S10) whether all the sensors provide a trip signal.

If this is the case, we can deduce (step S11) that a series arc has probably occurred at the head of the installation or that a parallel arc has occurred at the terminals of one or more of the strings 100, 101, i.e. between the points A and B in FIG. 1B.

It is then possible (step S12) to test the dV/dt sign:
If dV/dt is positive, the arc is probably a "series"-type arc (S13), at the head of the installation;
If it is negative, it is more likely a "parallel" arc (S14) between the points A and B in FIG. 1B.

In the event that none of the sensors have emitted a trip signal (S15), one of the following three hypotheses is possible:
there is a "series" arc on one of the strings;
there is a "series" arc in a module;
there is a "parallel" arc across the terminals of a module.

In order to estimate which of these three cases applies, we can test (step S20) whether all of the sensors of the same string have a positive dV/dt voltage variation.

If this is the case, one can deduce that a "series" arc is present on the string concerned (step S21).

If this is not so, this may be the case of a "series" arc in a module, or a "parallel" arc across the terminals of a module (S22).

The method could be limited to the aforementioned steps, however additional steps can take place to determine which of the two cases in the previous step S22 is the most likely to have occurred.

For this purpose, we look to determine whether the final voltage is equal to the arc voltage on the module concerned, with a dV/dt variation of less than zero (step S30).

If the response is negative, this is probably a "series" arc across the terminals of a module (step S31).

If the response is positive, this is probably a "parallel" arc within a module (step S32).

Figure 7B:
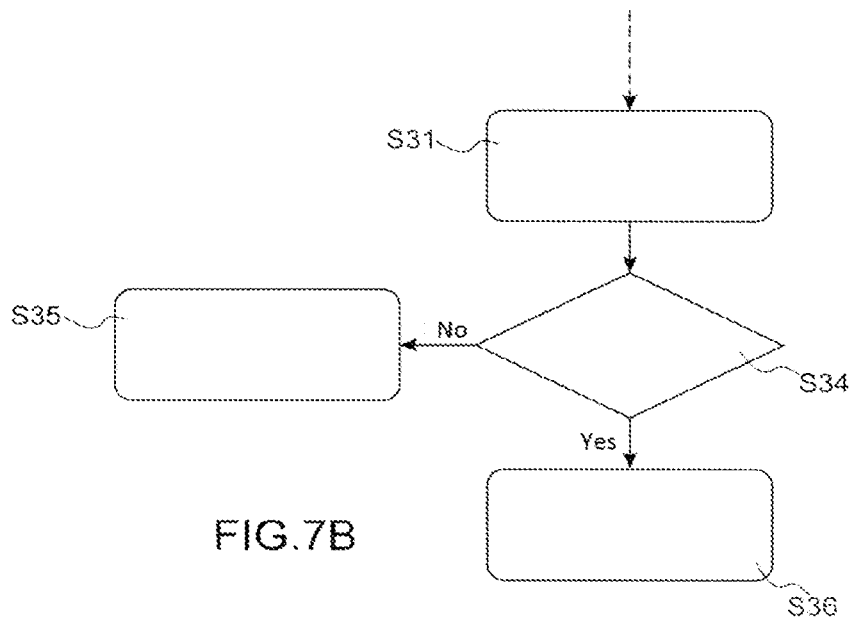

One alternative to this method, illustrated in FIG. 7B, concerns the case of a system wherein a diode 130, 313 is present at the head of each string. In this case, a negative response to the question in step S30 means that a "series" arc could have occurred at the terminals within a module or that a parallel arc could have occurred between the anode of the diode positioned at the head of the string concerned and the means 10. In order to determine which of these two cases applies, we look to determine whether the final voltage is equal to the voltage $V_{arc}/n_{mod}$ at the terminals of each of the modules of the string concerned (step S34).

If the response is negative, this is probably a "series" arc across the terminals of a module (step S35).

If the response is positive, this is probably a "parallel" arc between the anode of the diode positioned at the head of the string concerned and the means 10 (step S36).

The invention is described hereinabove for applications with direct current, wherein the means 10 are used to maintain a stable output voltage for the strings of the PV modules. However, the inverter 10 can produce interference, which in turn results in a variable, sine-wave voltage at a frequency that is, for example, equal to 100 Hz.

The teachings of this invention remain applicable to this type of situation.

Figure 8:
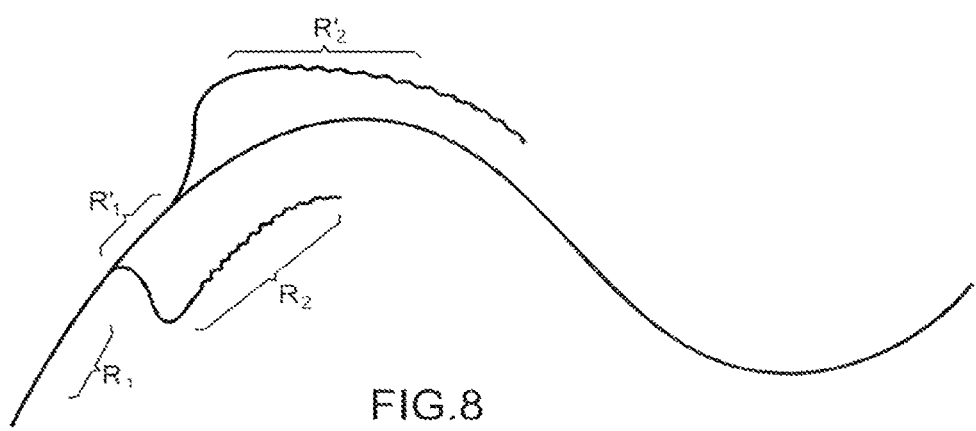
FIG. 8 shows a portion of a sine-wave signal, for example in the case of an inverter generating interference.

A part of the corresponding sine-wave signal is shown in FIG. 8.

A voltage variation described hereinabove takes place on such a signal, between the portions of the signal that show substantially stable slopes.

Thus, in the case of a parallel arc, the variation described hereinabove with reference to FIGS. 3A and 3B takes place in this case between a portion $R_1$ of the signal that shows a substantially constant, positive slope and another portion $R_2$ of the signal that also shows a substantially constant, positive slope. Similar reasoning applies if the arc occurred in a decreasing portion of the sine-wave signal, whereby the voltage variation would occur between a portion of the signal that shows a substantially constant, negative slope and another portion of the signal that also shows a substantially constant, negative slope.

In the case of a "series"-type arc, the variation described hereinabove with reference to FIG. 5 takes place between a portion $R'_1$ of the signal that shows a substantially constant, positive slope and another portion $R'_2$ of the signal that also shows a substantially constant, positive slope. Similar reasoning applies if the arc occurred in a decreasing portion of the sine-wave signal, whereby the voltage variation would occur between a portion of the signal that shows a substantially constant, negative slope and another portion of the signal that also shows a substantially constant, negative slope.

In these various cases of variable, sinus-wave voltage, the voltage variations measured by the means $110_1$-$110_3$ or $111_1$-$111_3$ have the same properties (variation magnitude, rise or fall time) as those previously described in the various cases.

The invention can further be applied to the case of a system operating using alternating current.

Example embodiments of a device for detecting an arc implement technical means allowing for the acquisition of the signal and the discrimination of a signature of the aforementioned type.

Different technical solutions are capable of achieving this.

Figure 9:
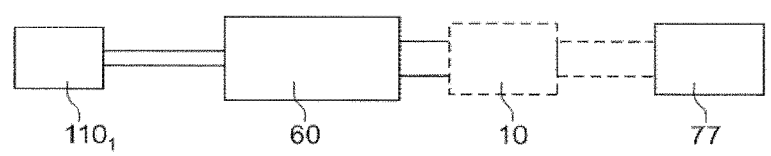
FIG. 9 shows an embodiment of digital means designed to acquire and process a signal according to a method according to the invention.

One example embodiment of such a device is illustrated in FIG. 9: this is an embodiment in digital mode, using an acquisition string, comprising one of the voltage measurement means $110_1$ and an analogue/digital converter 60 designed to differentiate the signature from other ambient noise. This digital embodiment does not require filtering. According to the calculation method used, the converter 60 samples the signal at a frequency of between 100 kHz and 5 MHz. Sampling at about 100 kHz, therefore at low frequency, is very advantageous in terms of cost. Advantageously, the sampling frequency is between 90 kHz and 600 kHz. Digital processing means are used to calculate the different values and implement the processing steps according to the invention.

Data processing means 77, specially programmed for this purpose, are designed to store and/or analyse the voltage values measured to establish the presence of a parallel arc. These means 77 can, for example, include a microprocessor or a computer.

Other technical solutions, such as analogue solutions, are possible. One is therefore looking to isolate the voltage measured, or the signature of the electric arc, from other voltage interference observed at the input of the voltage detection means. Indeed, in a PV system, the voltage is not perfectly smooth. Interference remains, in particular at 100 Hz, with a sine-wave shape and a variable magnitude depending on the level of power injected by the inverter 10 on the grid: these are harmonics generated by the inverter, which are transferred to its input and therefore to the continuous part of the PV installation. Some interference can have a higher frequency, for example Dirac-type interference, which represents interference caused by motor start-up or any other element located close to the PV installation and emitting electromagnetic interference. For example, a motor can be located in an environment close to the PV installation and emit an interfering electromagnetic field or be powered by the inverter output.

Finally, interference linked to the use of a powerline communication (PLC) device can disrupt voltage detection means. This interference can originate, for example, from the presence in the PV installation of smart systems communicating via powerline communication (PLC) means.

Figure 10:
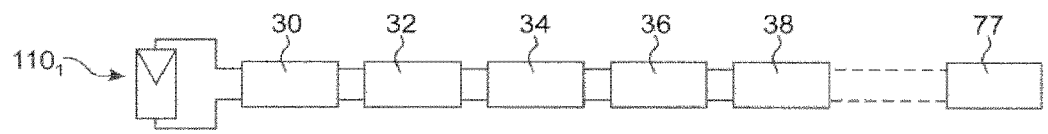
FIGS. 10 and 11 show other embodiments of the signal acquisition and processing means, according to a method according to the invention.

One analogue example embodiment consists in the use of cascading passive analogue filters, as illustrated in FIG. 10. In this figure, as well as in the following figure, the reference 110$_1$ designates one of the voltage measurement means in FIG. 1C; the same diagram could be reproduced for each of the other voltage measurement means.

In this example, the circuit comprises 3 stages: a 1$^{st}$ passive filter 30 (band-pass filter), a 2$^{nd}$ passive filter 32 (high-pass filter) and an amplifier 34.

These stages can be grouped together into a single stage. These stages can be followed by a buffer 36 and by disconnection means 38 for disconnecting the PV module from the electric circuit to secure the former. The buffer is used to filter the bouncing signals of the signal measured. An electric arc is rarely evident and is formed from a multitude of arcing processes before stabilising its plasma: only the first arcing must be detected.

The filters 30, 32 are used to isolate the correct frequency (with the characteristic rise or fall time having the aforementioned values) and therefore to reject the low frequencies (preferably below 1,000 Hz) and the high frequencies.

This filtering can also take place with active elements thus increasing selectivity (by about 6 instead of about 1 or 2 with passive filtering). The device therefore includes means forming an active filter (high-pass filter), means forming an amplifier and comparator, means forming a passive filter (low-pass filter), means forming a passive filter (low-pass filter), a buffer and disconnection means.

Figure 11:
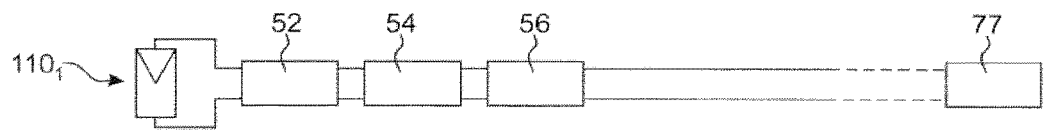

Finally, a combination of analogue and digital means is possible, as illustrated in FIG. 11, comprising:
 disconnection means 52,
 means 54 forming an amplifier and comparator,
 digital processing means 56.

Other embodiments are possible, for example the amplification and comparison functions are not necessarily within a same device 54.

In the various analogue devices described, the voltage variation and corresponding characteristic time (rise and fall time) are detected, in accordance with one of the aforementioned methods, and in particular:
 via the comparator for the voltage variation,
 via the filter selectivity, the rise or fall time for this variation, between 0.01 µs and 10 µs (case of a parallel arc) or between 0.5 µs and 5 µs (case of a series arc).

On a whole, the more a digital system is preferred, the faster the device response time. A fast response time (of several tens of microseconds) is advantageous as this allows the appearance of the arc plasma to be limited, thus preventing physical damage to the system. The lower the number of components required to perform the function, the lower the cost, hence the interest in working only on the voltage signature and in analogue mode (not in current or RF with heavy digital processing).

The legends for the steps in FIG. 7A are:
 S10: tripping of all sensors?
 S11: series arc at the head or parallel arc across the terminals of one or more of the strings
 S12: dV/dt>0?
 S13: probable "series"-type arc
 S14: probable "parallel"-type arc
 S15: series arc on a single string
 series arc within a module
 parallel arc across the terminals of a module
 S20: all sensors of a string where dV/dt>0?
 S21: Series arc on the string concerned
 S22: "series"-type arc within a module
 parallel arc across the terminals of a module
 S30: Vfinal=Varc on the module concerned where dV/dt<0
 S31: "series"-type arc within a module where dV/dt<0
 S32: parallel arc across the terminals of a module.

The legends for the steps in FIG. 7B are:
 S31: "series"-type arc within a module where dV/dt<0
 S34: Vfinal=Varc/nmod?
 S35: "series"-type arc within a module where dV/dt<0
 S36: "Parallel"-type arc between the anode of the diode positioned at the head of the string concerned and the means 10.

The invention claimed is:

1. A method for estimating a series or parallel nature and a location of an arc in a photovoltaic device, including N (N=1 or N>1) strings of photovoltaic modules, connected to a charge device having a capacitive behavior for the modules, the method comprising:
  a) measuring, at terminals of each of the modules of each string, evolution of voltage over time, at least during formation of an electric arc;
  b) identifying modules at the terminals of which a voltage variation occurs between a first duration during which the voltage has a substantially stable slope and a second duration during which the voltage has a substantially stable slope for a duration of at least 5 µs, which immediately follows the voltage variation, and identifying the positive or negative direction of each voltage variation;

c) estimating the location of the arc in the photovoltaic device and whether the arc has a series or parallel nature, based on the information on the modules at the terminals of which the voltage variation occurs, and the positive or negative direction of each voltage variation; and d) disconnecting the photovoltaic modules from other circuits connected to the photovoltaic device based on the location of the arc and the series or parallel nature of the arc, wherein, when the voltage at the terminals of a module of one of the strings of the device decreases, when the voltage at the terminals of all other modules of the same string increases, it is concluded that a parallel arc is occurring across the terminals of the module or that a series arc is occurring within the module, and wherein, when the voltage at the terminals of the module:

decreases to the arc voltage value, it is concluded that a parallel arc is occurring across the terminals of the module, and decreases by an absolute value substantially equal to $V_{arc}/((1/n_{mod})-1)$, wherein $V_{arc}$ is the final voltage of the arc, and $n_{mod}$ is the number of modules in the string concerned, it is concluded that a series arc is occurring within the module.

2. The method according to claim 1, wherein, before c), at least one of a magnitude of the voltage variation, a duration during which the voltage variation occurs, or mean rate of the variation is estimated, to observe effective presence of the arc.

3. The method according to claim 1, wherein, when the voltage at the terminals of each of the modules of each string decreases, it is concluded that a parallel arc is occurring across the main terminals of the device.

4. The method according to claim 1, wherein:

when the voltage at the terminals of each of the modules of each string increases, it is concluded that a series arc is occurring between one of the strings and the charge device;

or, when the voltage at the terminals of each of the modules of one of the strings increases, wherein a voltage variation is not observed at the terminals of the modules of the other strings, it is concluded that a series arc is occurring within the strings, however not within one of the modules of the string.

5. The method according to claim 1, wherein a diode is present at a head of each string, and wherein, when the voltage at the terminals of each of the modules of a first string decreases, and wherein a voltage variation is not observed at the terminals of the modules of the other strings, it is concluded that a parallel arc is occurring between the diode of the first string and the charge device.

6. The method according to claim 1, wherein passive and/or active filtering of the evolution of the detected voltage over time takes place.

7. The method according to claim 1, wherein the evolution of each voltage over time is digitized, whereby b) to c) are performed based on digital voltage values.

8. The method according to claim 1, wherein the current is a direct current.

9. A device for estimating a series or parallel nature and a location of an arc in a photovoltaic system, including N (N=1 or N>1) strings of photovoltaic modules, connected to a charge device having a capacitive behavior for the modules, the device comprising:

a) detectors configured to detect, at terminals of each of the modules of each string, evolution of voltage over time during formation of an electric arc;

b) a data processor configured to:

identify modules at the terminals of which at least one voltage variation occurs, between a first duration during which the voltage has a substantially stable slope and a second duration of at least 5 µs, during which the voltage has a substantially stable slope and which immediately follows the voltage variation, and identify a positive or negative direction of the voltage variation, estimate the location of the arc in the photovoltaic device, and whether the arc has a series or parallel nature, based on the information on the modules at the terminals of which the voltage variation occurs, and on the positive or negative direction of each voltage variation, and cause a switch to disconnect the photovoltaic modules from other circuits connected the photovoltaic device based on the location of the arc and the series or parallel nature of the arc, wherein, when the detectors at the terminals of one module of one of the strings of the device detect a voltage decrease, when the detectors at the terminals of all other modules of the same string detect a voltage increase over time, it is concluded that a parallel arc is occurring across the terminals of the module or that a series arc is occurring within the module, and wherein:

when the detectors at the terminals of the module detect a voltage decrease over time to the arc voltage value, it is concluded that a parallel arc is occurring across the terminals of the module, and when the detectors at the terminals of the module detect a voltage decrease of an absolute value substantially equal to $V_{arc}/((1/n_{mod})-1)$, wherein $V_{arc}$ is the final voltage of the arc, and $n_{mod}$ is the number of modules in the string concerned, it is concluded that a series arc is occurring within the module.

10. The device according to claim 9, wherein the data processor is further configured to estimate at least one of a magnitude of the variation, a duration during which the variation occurs, or a mean rate of the variation, to observe effective presence of the arc.

11. The device according to claim 9, wherein, when the detectors at the terminals of each of the modules of each string detect a voltage decrease over time, it is concluded that a parallel arc is occurring across the main terminals of the device.

12. The device according to claim 9, wherein:

when the detectors at the terminals of each of the modules of each string detect a voltage increase, it is concluded that a series arc is occurring between any one of the strings and the charge device; and when the detectors at the terminals of each of the modules of a string detect a voltage increase, when the detectors at the terminals of all other modules of the other strings do not detect a voltage variation, it is concluded that a series arc is occurring within one of the strings, however not within one of the modules of the string.

13. The device according to claim 9, wherein a diode is present at a head of each string, and wherein, when the voltage at the terminals of each of the modules of a first string decreases, and wherein a voltage variation is not observed at the terminals of the modules of the other strings, it is concluded that a parallel arc is occurring between the diode of the first string and the charge device.

14. The device according to claim 9, comprising:
- an analog filter of the evolution of the voltage over time;
- a digital filter of the evolution of the voltage over time; and
- a converter digitizing the voltage evolution data.

15. The device according to claim 9, wherein the charge device having the capacitive behavior for the modules includes a converter, an inverter or a battery.

16. A device for estimating a series or parallel nature and a location of an arc in a photovoltaic system, including N (N=1 or N>1) strings of photovoltaic modules, connected to a charge device having a capacitive behaviour for the modules, the device comprising:
- a) detection means for detecting, at terminals of each of the modules of each string, evolution of voltage over time during formation of an electric arc;
- means for
- b) identifying modules at the terminals of which at least one voltage variation occurs, between a first duration during which the voltage has a substantially stable slope and a second duration of at least 5 µs, during which the voltage has a substantially stable slope and which immediately follows the voltage variation, and for identifying a positive or negative direction of the voltage variation, and
- c) estimating the location of the arc in the photovoltaic device, and whether the arc has a series or parallel nature, based on the information on the modules at the terminals of which the voltage variation occurs, and on the positive or negative direction of each voltage variation; and
- d) means for disconnecting the photovoltaic modules from other circuits connected to the photovoltaic device based on the location of the arc and the series or parallel nature of the arc, wherein, when the detection means at the terminals of one module of one of the strings of the device detect a voltage decrease, when the detection means at the terminals of all other modules of the same string detect a voltage increase over time, it is concluded that a parallel arc is occurring across the terminals of the module or that a series arc is occurring within the module, and wherein:

when the detection means at the terminals of the module detect a voltage decrease over time to the arc voltage value, it is concluded that a parallel arc is occurring across the terminals of the module, and when the detection means at the terminals of the module detect a voltage decrease of an absolute value substantially equal to $V_{arc}/((1/n_{mod})-1)$, wherein $V_{arc}$ is the final voltage of the arc, and $n_{mod}$ is the number of modules in the string concerned, it is concluded that a series arc is occurring within the module.

* * * * *